United States Patent [19]

Kurita

[11] Patent Number: 5,371,401
[45] Date of Patent: Dec. 6, 1994

[54] SEMICONDUCTOR INTEGRATED CIRCUIT FULLY ISOLATED FROM THE SUBSTRATE

[75] Inventor: Kozaburo Kurita, Ohme, Japan
[73] Assignee: Hitachi, Ltd., Tokyo, Japan
[21] Appl. No.: 112,340
[22] Filed: Aug. 27, 1993
[30] Foreign Application Priority Data
  Aug. 31, 1992 [JP] Japan .................................. 4-230787
[51] Int. Cl.⁵ .................... H01L 27/06; H01L 27/102; H01L 27/105
[52] U.S. Cl. .................... 257/524; 257/350; 257/378; 257/370
[58] Field of Search ............... 257/370, 347, 371, 378, 257/66, 68, 350, 524, 349, 648

[56] References Cited

U.S. PATENT DOCUMENTS
  5,107,321 4/1992 Ilderem et al. ...................... 257/648

FOREIGN PATENT DOCUMENTS
  4-69966 7/1990 Japan .

OTHER PUBLICATIONS

IBM Technical Disclosure Bulletin; "BiCMOS Isolation Technology using EPI Overgrowth ..."; Jul. 1992 vol. 35 No. 21.

T. Tanaka et al., "Analysis of P+Poly Si Double-Gate Thin-Film Soi MOSFETs", IEDM, Tech. Dig. pp. 683–686, 1991.

Primary Examiner—Rolf Hille
Assistant Examiner—Wael M. Fahmy
Attorney, Agent, or Firm—Antonelli, Terry, Stout & Kraus

[57] ABSTRACT

A mixed-type semiconductor integrated circuit device of a type wherein a semiconductor layer is formed on the surface of a semiconductor substrate with an insulating layer interposed therebetween and each of bipolar transistors and MISFETs is formed in the semiconductor layer. In the semiconductor integrated circuit device, a base insulating layer for each bipolar transistor formed in said semiconductor layer is fabricated in the form of a thin film thickness and a base insulating layer for each MISFET formed in said semiconductor layer is fabricated in the form of a thick film thickness.

12 Claims, 13 Drawing Sheets

SEMICONDUCTOR INTEGRATED CIRCUIT FULLY ISOLATED FROM THE SUBSTRATE

BACKGROUND OF THE INVENTION

The present invention relates to a mixed-type semiconductor integrated circuit device having bipolar transistors and MISFETs (Metal-Insulator-Semiconductor Field Effect Transistors) mounted on the same substrate, and particularly to a mixed-type semiconductor integrated circuit device using an SOI (Silicon On Insulator) structure of a type wherein bipolar transistors and MISFETs are formed in a semiconductor layer formed on a substrate with an insulating layer interposed therebetween.

A MOSFET (Metal-Oxide-Semiconductor Field Effect Transistor) using an SOI structure has been disclosed in the article "IEDM" (International Electron Device Meeting), Tech. Dig. p683–686, 1991, for example.

A mixed-type semiconductor integrated circuit device using the SOI structure has been disclosed in, for example, Japanese Patent Application Laid-Open Publication No. 4-69966 (Application date: Jul. 10, 1990) filed by the applicant of the present application. In the disclosure, a silicon layer is formed on the surface of a semiconductor substrate with an insulating layer interposed therebetween. Further, bipolar transistors and MISFETs are formed in the silicon layer.

Each of the MISFETs has a source region, a channel forming region and a drain region respectively successively arranged in the silicon layer, and a gate electrode formed on the surface of the channel forming region with a gate insulating film interposed therebetween. In the mixed-type semiconductor integrated circuit device using the SOI structure, the source and drain regions of each MISFET are substantially covered with an insulator and the parasitic capacitance applied to each of the source and drain regions can be reduced. Since a circuit comprised of complementary MISFETs, for example, can provide high-speed charging and discharging rates upon activation of a circuit serving as the following stage, the mixed-type semiconductor integrated circuit device can be operated at high speed.

The silicon layer in which the channel forming region of the MISFET is fabricated, is formed with a film thickness selectively thinner than that of the silicon layer formed with the bipolar transistor, for example, a film thickness of 100 [nm] or less. As a result, the channel forming region of the MISFET can be completely depleted under the operation of the MISFET and hence a Kink characteristic can be avoided.

When, on the other hand, it is required to make the operating speed of each bipolar transistor faster, the bipolar transistor is fabricated in the form of a vertical structure and an npn type. The bipolar transistor extends in the direction of depth of the silicon layer from the surface thereof along the direction of the film thickness of the silicon layer and has respective operating regions corresponding to an n-type emitter region, a p-type base region and an n-type collector region, which are successively arranged in the silicon layer. The silicon layer formed with each bipolar transistor is formed with a film thickness selectively thicker than that of the silicon layer formed with each MISFET. As a result, the bipolar transistor can provide a reduction in resistance of the n-type collector region formed as a buried type in the silicon layer. Further, the cut-off frequency $f_T$ can be improved. Thus, the operating rate of the mixed-type semiconductor integrated circuit device can be made faster.

Further, all of element structures, pattern structures and manufacturing processes of the mixed-type semiconductor integrated circuit device can be used in common and simplified by applying the SOI structure to each bipolar transistor in a manner similar to the MISFET.

SUMMARY OF THE INVENTION

However, the present inventor has found out that the mixed-type semiconductor integrated circuit device using the aforementioned SOI structure does not take into consideration the following points.

(1) The mixed-type semiconductor integrated circuit device is constructed in such a manner that the insulating layer provided between the semiconductor substrate and the silicon layer is formed with a uniform film thickness. When it is desired to decrease the parasitic capacitance formed between each of the source and drain regions of each MISFET and the semiconductor substrate, the film thickness of the insulating layer becomes greater as a whole. A silicon oxide film is normally used as the insulating layer. The thermal conductivity of the silicon oxide film is smaller by about a number in two figures than that of the silicon. The thermal conductivity of the silicon is 168 [W/m·K], whereas the thermal conductivity of the silicon oxide film falls within a range of 0.5 [W/m·K] to 1.4 [W/m·K]. Since a steady-state current flows between an operating power source and a reference power source, heat is generated in quantity in, for example, an ECL (Emitter Coupled Logic) circuit comprised of bipolar transistors. Thus, it cannot be expected that the heat generated in the ECL circuit be dissipated into the semiconductor substrate through the insulating layer. Therefore, the power to be consumed by the ECL circuit should be reduced and hence the operating rate of the ECL circuit becomes slow.

(2) When it is desired to solve the above problem (1), the film thickness of the insulating layer becomes small as a whole. When the film thickness of the insulating layer becomes thin, the parasitic capacitance provided between each of the source and drain regions of each MISFET and the semiconductor substrate increases. Particularly, in a MISFET having low driving capability, which fabricates an internal logic circuit, for example, an inverter circuit exclusive of a circuit corresponding to the final output stage, the rate of application of the parasitic capacitance to each of the source and drain regions increases. Thus, when the following-stage circuit is activated, both the charging and discharging rates become slow. Therefore, the operating speed of the internal logic circuit become slow.

Objects of the present invention are as follows:

(1) It is a first object of the present invention to provide a mixed-type semiconductor integrated circuit device using an SOI structure, which can improve the efficiency of heat radiation, decrease the parasitic capacitance and make the operating speed of a circuit employed in the semiconductor integrated circuit device faster.

(2) It is a second object of the present invention to achieve the first object (1) and to provide a mixed-type semiconductor integrated circuit device using an SOI structure, which can prevent a Kink characteristic of a MISFET from occurring and improve the cut-off frequency of a bipolar transistor.

(3) It is a third object of the present invention to achieve the second object (2) and to provide a mixed-type semiconductor integrated circuit device using an SOI structure, which can flatten the surface of each of elements.

The above and other objects, novel features and advantages of the present invention will become apparent from the following description and the appended claims, taken in conjunction with the accompanying drawings.

The summary of the invention disclosed in the present application will now be described in brief by specific or typical embodiments as follows:

(1) In a semiconductor integrated circuit device wherein a semiconductor layer is formed on the surface of a substrate with an insulating layer interposed therebetween, each of bipolar transistors is formed in a first region of the semiconductor layer and each of MISFETs is formed in a second region different from the first region of the semiconductor layer, an insulating layer formed as a base for each bipolar transistor fabricated in the first region of the semiconductor layer is fabricated in the form of a thin film thickness. Further, a film thickness of an insulating layer formed as a base for each MISFET fabricated in the second region of the semiconductor layer is greater than that of the base insulating layer in the first region.

(2) The first region of the semiconductor layer described in the aforementioned means (1) is shaped in the form of a thick film thickness. Further, the second region of the semiconductor layer is thinner than that of the first region of the semiconductor layer. Each bipolar transistor having a vertical structure of a type wherein respective operating regions Corresponding to a collector region, a base region and an emitter region are successively arranged along the direction of the film thickness of the semiconductor layer, is formed in the first region of the semiconductor layer. Each MISFET having a channel forming region completely depleted when the voltage is applied to a gate electrode thereof is formed in the second region of the semiconductor layer.

(3) The sum of the film thickness of the first region in which each bipolar transistor in the semiconductor layer is formed and the film thickness of the insulating layer in the first region is equal in dimension to the sum of the film thickness of the second region in which each MISFET in the semiconductor layer is formed and the film thickness of the insulating layer in the second region.

According to the aforementioned means (1), the following operations and effects are obtained.

(A) Since the thermal resistance of a radiating path between each bipolar transistor and a substrate can be reduced, the heat generated under the operation of each bipolar transistor can be radiated over the entire area of the substrate through an insulating layer whose film thickness is thin. As a result, an increase in temperature of each bipolar transistor can be reduced and the power to be consumed by each bipolar transistor can be increased. Thus, the operating speed of a circuit made up of the bipolar transistors can be rendered faster.

(B) Since the distance between the MISFET and the substrate which are spaced away from each other, can be increased, the parasitic capacitance set to the MISFET, particularly, each of source and drain regions can be decreased. As a result, the operating speed corresponding to either one of the charging rate and the discharging rate of the MISFET can be made faster. It is therefore possible to operate a circuit made up of the MISFETs at high speed.

(C) Since both the bipolar transistor and the MISFET can be separated from the substrate with the insulating layer interposed therebetween and the minority carriers produced by allowing $\alpha$-rays to enter into the substrate can be prevented from entering into the bipolar transistor and the MISFET, a characteristic resistant to the soft error caused by the $\alpha$-rays can be improved.

(D) Since each bipolar transistor is separated from the substrate with the insulating layer interposed therebetween, a voltage-resistant characteristic between each bipolar transistor and the substrate can be improved as compared with the separation of a pn junction.

According to the aforementioned means (2), the following operations and effects can be obtained in addition to the operations and effects described in the above means (1).

(A) Since the buried-type collector region (or emitter region) arranged in the semiconductor layer for each bipolar transistor of the vertical structure can take an increase in the dimension thereof which extends in the direction coincident with the direction of the film thickness of the semiconductor layer, the resistance of the collector region can be decreased and the cut-off frequency $f_T$ of each bipolar transistor can be improved.

(B) Since a punch-through produced between the source and drain regions; of the MISFET can be eliminated and the length (channel length or gate length) of the channel forming region can be decreased, the rate of switching action of the MISFET can be made faster. Further, since a reduction in the diffusion of carriers and an improvement in the mobility of the carriers can be made within the channel forming region of the MISFET, the rate of the switching action of the MISFET can be raised. Moreover, since the channel forming region of the MISFET can be completely depleted, a Kink characteristic can be prevented from occurring.

According to the above-described means (3), since the height of the surface of each bipolar transistor can be made coincident with that of the surface of the MISFET, the surface of each of the devices or elements can be formed in a flat manner in addition to the operations and effects described in the means (1).

The construction of the present invention will hereinafter be described by preferred embodiments in which the present invention is applied to a mixed-type semiconductor integrated circuit device using an SOI structure having a monocrystalline silicon substrate serving as a substrate.

Incidentally, the elements of structure, which are shown in all drawings for describing the embodiments and identical in function to one another, are identified by like reference numerals, and their repeated description will therefore be omitted.

DETAILED DESCRIPTION OF THE PREFERRED EMBODIMENTS (First Embodiment)

The configuration of principal parts of a mixed-type semiconductor integrated circuit device according to a first embodiment of the present invention will hereinafter be described with reference to FIG. 1 (which is a cross-sectional view).

Figure 1:
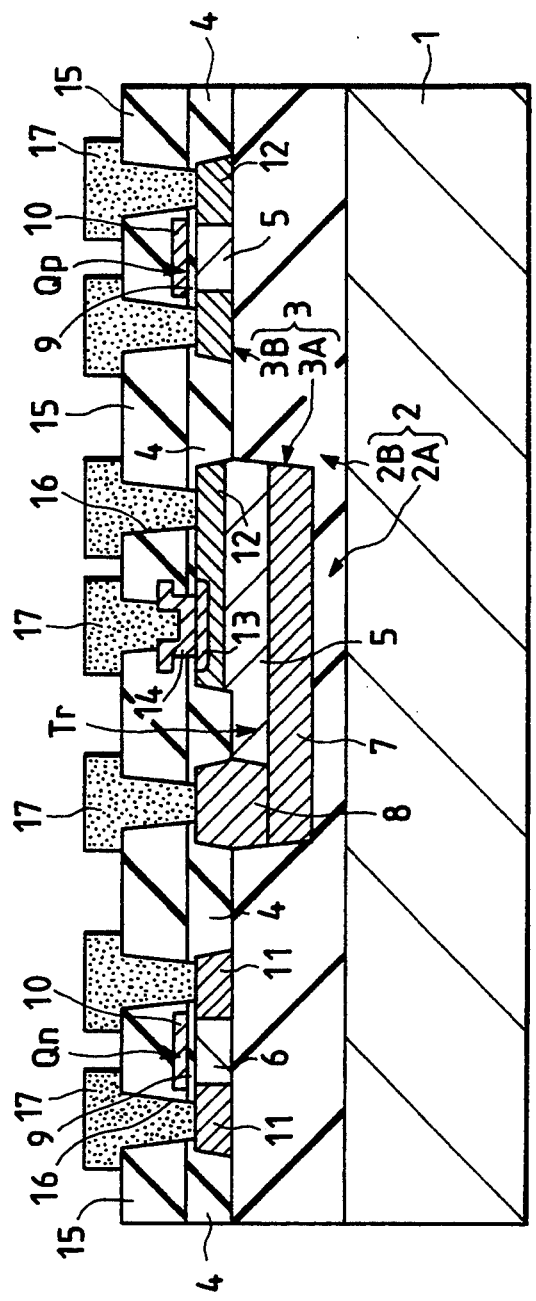
FIG. 1 is a cross-sectional view showing a mixed-type semiconductor integrated circuit device according to a first embodiment of the present invention.

As shown in FIG. 1, the semiconductor integrated circuit device makes use of an SOI structure. The semiconductor integrated circuit device has a semiconductor layer 3 formed on one surface of a semiconductor substrate 1 serving as a motherboard or base with an insulating layer 2 interposed therebetween. Bipolar transistors Tr and complementary MISFETs Qn and Qp are formed in the semiconductor layer 3.

The semiconductor substrate 1 is formed of a monocrystalline silicon substrate, whereas the insulating layer 2 is made up of silicon oxide. The monocrystalline silicon substrate has a thermal conductivity (i.e., 168[W/m·K]) higher than that of the silicon oxide (whose thermal conductivity fall within a range from 0.5[W/m·K] to 1.4[W/m·K]) and is excellent in adhesion to the insulating layer 2.

The insulating layer 2 is basically provided to electrically separate the respective elements formed in the semiconductor substrate 1 and the semiconductor layer 3 from one another. The insulating layer 2 comprises an insulating layer 2A having a film thickness which is thin in a region where each bipolar transistor Tr is formed, and an insulating layer 2B having a film thickness which is thick in a region where each complementary MISFET is formed.

The insulating layer 2A serves so as to decrease the thermal resistance of a radiating path between each bipolar transistor Tr and the semiconductor substrate 1 and can efficiently transfer heat generated under the operation of each bipolar transistor Tr to the semiconductor substrate 1. Since the surface of the semiconductor substrate 1 is flat in the present embodiment, the insulating layer 2A has a film thickness of 400[nm], for example, which extends upwards from the surface of the semiconductor substrate 1. Detailed values will be described later. However, when the separation between the bipolar transistor Tr and the semiconductor substrate 1 is effected by the insulating layer 2A whose film thickness ranges from 300[nm] to 350[nm], the value of the parasitic capacitance applied to an n-type graft collector region of each bipolar transistor Tr employed in the present embodiment is equal to that at the time that the separation between each bipolar transistor Tr and the semiconductor substrate 1 is effected by a pn junction. Therefore, the parasitic capacitance cannot be reduced. Thus, the insulating layer 2A is formed with the film thickness of 400[nm] as described above or with a film thickness of 400[nm] or greater within a range of a film thickness thinner than that of the insulating layer 2B.

In the insulating layer 2B, the parasitic capacitance provided between each complementary MISFET, particularly, each of source and drain regions and the semiconductor substrate 1 can be decreased. The insulating layer 2B has a film thickness of 2.0[$\mu$m], for example, which extends upward from the surface of the semiconductor substrate 1.

As indicated in the central region in FIG. 1, the bipolar transistor Tr is formed in a semiconductor layer 3A of the semiconductor layer 3, which is fabricated in the form of a thick film thickness. The so-formed semiconductor layer 3A is fabricated on the insulating layer 2A of the insulating layer 2 serving as a base, which has been fabricated in the form of a thin film thickness. Each complementary MISFET comprises an n channel MISFET Qn and a p channel MISFET Qp. As indicated in a left-hand region in FIG. 1, the n channel MISFET Qn is formed in a semiconductor layer 3B of the semiconductor layer 3, which has been formed with a thin film thickness. Similarly, the p channel MISFET Qp is formed in the semiconductor layer 3B of the semiconductor layer 3, which has been formed in the form of the thin film thickness, as indicated in a right-hand region in FIG. 1. The so-formed semiconductor layer 3B is disposed on the insulating layer 2B of the base insulating layer 2, which has been formed with the thick film thickness.

The semiconductor layer 3 is basically comprised of a monocrystal silicon. The semiconductor layer 3A of the semiconductor layer 3 is fabricated in the form of the thick film thickness with a principal purpose that an increase in the thickness thereof which extends in the direction coincident with the direction of the film thickness of the semiconductor layer 3 and a reduction in resistance of the collector are effected in the n-type graft collector region of each bipolar transistor Tr. This type of semiconductor layer 3A is formed with a film thickness of 1.7[$\mu$m], for example.

The semiconductor layer 3B of the semiconductor layer 3 is formed with the thin film thickness in such a manner that a decrease in the thickness thereof which extends in the direction coincident with the direction of the film thickness of the semiconductor layer 3 and the complete depletion of carries in an activated state of the MISFET are actually achieved as a principal object in channel forming regions 5 and 6 of the respective complementary MISFETs. The semiconductor layer 3B is formed with a film thickness of 100[nm] or less, for example.

The surface of the semiconductor layer 3A of the semiconductor layer 3 substantial coincides in position with the surface of the semiconductor 3B. The overall surface of the semiconductor layer 3 is formed in a flat manner. That is, the sum of the film thickness of the semiconductor layer 3A of the semiconductor layer 3, which has been fabricated in form of the thick film thickness and the film thickness of the insulating layer 2A of the insulating layer 2, which has been fabricated in the form of the thin film thickness is equal in dimension to the sum of the film thickness of the semiconductor layer 3B thereof fabricated in the form of the thin film thickness and the film thickness of the insulating layer 2B thereof fabricated in the form of the thick film thickness.

Each of the bipolar transistors Tr is formed in the semiconductor layer 3A as described above so as to fall within a region at which the bottom thereof is surrounded by the insulating layer 2A and the sides thereof are surrounded by the insulating layer 2B and LOCOS (Local Oxidization of Silicon) 4. That is, each bipolar transistor Tr is of a vertical structure wherein respective operating regions corresponding to an n-type collector region, a p-type base region and an n-type emitter region are successively arranged in the direction which coincides with the direction of the film thickness of the semiconductor layer 3A, and is constructed in the form of an npn type.

The n-type collector region comprises an n-type intrinsic collector region, an n+-type graft collector region and an n+-type collector region for an increase in potential. The n-type intrinsic collector region is comprised of an n-type semiconductor region 5 having a low impurity density or level of $10^{16}$[atoms/cm$^3$] or so, for example. The n-type semiconductor region 5 is formed within a depth range of 200[nm] to 700[nm] of the semiconductor layer 3A so as to extend from the surface of the semiconductor layer 3A to the direction of depth thereof. The n+-type graft collector region is comprised of an n+-type semiconductor region 7 having a high impurity level of the order of $10^{19}$[atoms/cm$^3$] to $10^{20}$[atoms/cm$^3$], for example. The n+-type semiconductor region 7 is formed within a depth range of 700[nm] to 1.7[$\mu$m] of the semiconductor layer 3A, extending in the direction of depth of the semiconductor layer 3A from the surface thereof, so as to have a thick dimension of about 1.0[$\mu$m] which extends in the direction coincident with the direction of the film thickness of the semiconductor layer 3A. Thus, the n+-type graft collector region is formed in a high impurity level near a saturation region level and fabricated in the form off a film thickness of about two-third the film thickness of the semiconductor layer 3A formed with the thick film thickness. Therefore, the collector resistance can be sufficiently reduced. Further, the n+-type collector region for the increase in potential is made up of an n+-type semiconductor region 8 having a high impurity level.

The p-type base region is fabricated on a main surface of the n-type intrinsic collector region of the n-type collector region and comprised of a p-type semiconductor region 12 having a medium impurity level of the order of $10^{18}$[atoms/cm$^3$] to $10^{19}$[atoms/cm$^3$], for example.

The n-type emitter region is formed on a main surface of the p-type base region and made up of an n+-type semiconductor region 13 having a high impurity level of the order of $10^{20}$[atoms/cm$^3$] to $10^{21}$[atoms/cm$^3$], for example. The surface of the n+-type semiconductor region 13 is electrically connected to an emitter drawing electrode 14. The emitter drawing electrode 14 is made up of a polycrystalline silicon film in which arsenic (As) or (phosphorus (P) has been introduced as an n-type impurity, for example. The emitter drawing electrode 14 is also formed as an impurity diffusion source which forms the n-type emitter region.

The n+-type collector potential-increasing region of the m-type collector region of each bipolar transistor Tr and the p-type base region are respectively electrically connected with each wire or conductor pattern 17. Further, the n-type emitter region is electrically connected to the conductor pattern 17 with the emitter drawing electrode 14 interposed therebetween. Each conductor pattern 17 is formed on the surface of an interlayer insulating film 15 and electrically connected to its corresponding region through a connecting hole 16 defined in the interlayer insulating film 15. The conductor pattern 17 is made lip of an aluminum alloy for example. The aluminum alloy is of aluminum added with at least either one of Si for improving the resistance to alloy spike and Cu for improving the resistance to migration, for example.

The n channel MISFET Qn of each complementary MISFET is formed in the semiconductor layer 3B so as to fall within a region at which the bottom thereof is surrounded by the insulating layer 2B and the sides thereof are surrounded by the LOCOS 4. That is, the n channel MISFET Qn has a structure wherein an n-type source region, a p-type (or i-type) channel forming region and an n-type drain region are successively arranged in the direction which coincides with the direction of the surface of the semiconductor layer 3B, and a gate electrode 10 is formed on the surface of the p-type channel forming region with a gate insulating film 9 interposed therebetween.

When an operating voltage Vcc of the complementary MISFET is 3.3[V], each of the n-type source region and the n-type drain region is comprised of an n+-type semiconductor region 11 having a high impurity level of the order of $10^{19}$[atoms/cm$^3$] to $10^{20}$[atoms/cm$^3$], for example. The p-type channel forming region is made up of a p-type semiconductor region 6 having a low impurity level of $10^{15}$[atoms/cm$^3$] or so, for example. The gate insulating film 9 is formed of silicon oxide film, which has a thickness of the order of 8[nm] to 10[nm], for example. Each gate electrode 10 is made up of a polycrystalline silicon film, for example, which contains an impurity, e.g., P for reducing the resistance. The gate electrode 10 may be formed of a polycide comprised of the polycrystalline silicon film and a silicide film such as WSix, MoSix (x; 2, for example), which is stacked on the polycrystalline silicon film and has a high melting point.

Similarly to the n channel MISFET Qn, the p channel MISFET Qp is formed in the semiconductor layer 3B so as to fall within a region at which the bottom thereof is surrounded by the insulating layer 2B and the sides thereof are surrounded by the LOCOS 4. That is, tile p channel MISFET Qp has a structure wherein a p-type source region, an n-type (or i(intrinsic)-type) channel forming region and a p-type drain region are successively arranged in the semiconductor layer 3B, and a gate electrode 10 is formed on the surface of the n-type channel forming region with a gate insulating film 9 interposed therebetween.

Each of the p-type source region and the p-type drain region is comprised of a p+-type semiconductor region 12 having a high impurity level of the order of $10^{19}$[atoms/cm$^3$] to $10^{20}$[atoms/cm$^3$], for example. The n-type channel forming region is made up of an n-type semiconductor region 5 having a low impurity level of $10^{15}$[atoms/cm$^3$] or so, for example.

The n-type source region and n-type drain region of each n channel MISFET Qn and the p-type source region and p-type drain region of each p channel MISFET Qp are respectively electrically connected with their corresponding conductor patterns 17.

Figure 2A:
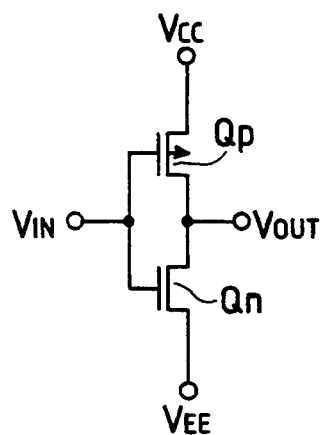
FIG. 2(A) is a circuit diagram of an inverter.
Figure 2B:
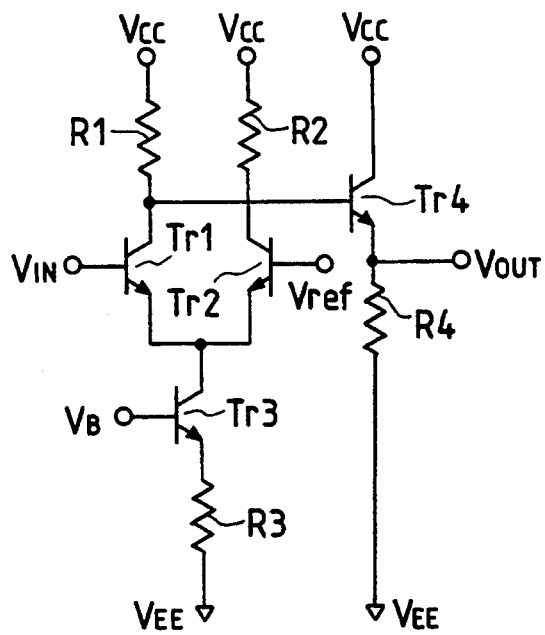
FIG. 2(B) is a circuit diagram of an ECL circuit.

FIG. 2(A) is a circuit diagram showing one example of an inverter circuit comprised of the complementary MISFETs. FIG. 2(B) is a circuit diagram showing one example of an ECL circuit comprised of the bipolar transistors Trs. Further, FIG. 2(C) is a view showing the waveform of each of input and output voltages of the inverter circuit, FIG. 2(E) is a view showing the waveform of a source current, FIG. 2(D) is a view illustrating the waveform of each of input and output voltages of the ECL circuit, and FIG. 2(F) is a view depicting the waveform of the source current.

As shown in FIG. 2(A), the inverter circuit comprises the n channel MISFET Qn and the p channel MISFET Qp. The gate electrodes of both the n and p channel MISFETS Qn and Qp are electrically connected to an input terminal $V_{IN}$, whereas the drain regions thereof are electrically connected to an output terminal $V_{OUT}$. The source region of the n channel MISFET Qn is electrically connected to a reference power source voltage $V_{EE}$. For example, a ground voltage 0[V] in the circuit is used as the reference power source voltage $V_{EE}$. The source region of the p channel MISFET Qp is electrically connected with an operating power source voltage $V_{CC}$. In the present embodiment, 3.3[V] is used as the power source voltage $V_{CC}$ as described above.

As illustrated in FIG. 2(B), the ECL circuit comprises four bipolar transistors Tr1 to Tr4 and four resistive elements R1 to R4. The base electrode of the bipolar transistor Tr1 is electrically connected to an input terminal $V_{IN}$, whereas the base electrode of the bipolar transistor Tr2 is electrically connected to a reference decision voltage $V_{ref}$. Further, the base electrode of the bipolar transistor Tr3 is electrically connected to a terminal $V_B$, whereas the emitter electrode of the bipolar transistor Tr4 is electrically connected to an output terminal $V_{OUT}$.

Figure 2C:
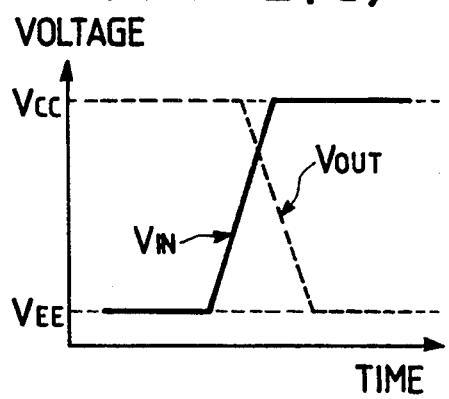
FIGS. 2(C) and 2(D) are respectively waveform diagrams showing input and output voltages, and FIGS. 2(E) add 2(F) are respectively waveform diagrams for describing source currents.
Figure 2D:
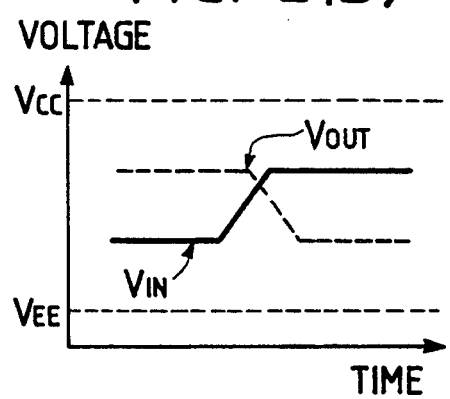
Figure 2E:
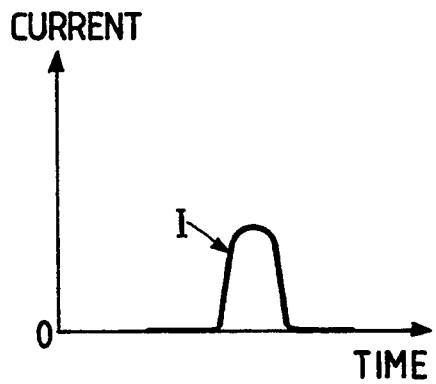
Figure 2F:
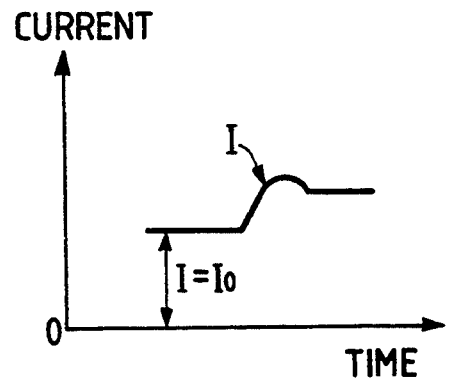

As depicted in FIGS. 2(C) and 2(E), the inverter circuit provides less power consumption and generates an extremely small amount of heat since the amplitude (difference between the input and output voltages) at the time of changeover of the input and output voltages is large but the current simply flows instantaneously upon changeover of the input and output voltages. On the other hand, the ECL circuit provides more power consumption and generates a large amount of heat as shown in FIGS. 2(D) and 2(F) since the amplitude at the time of changeover of the input and output voltages is small but a steady-state current flows in the circuit as $I_0$.

A method of fabricating the aforementioned semiconductor integrated circuit device will next be described in brief with reference to FIGS. 3 through 20 (which correspond to the cross-sectional views shown every processing steps).

Figure 3:
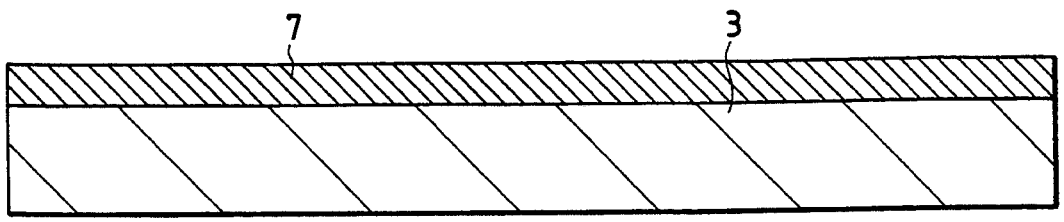
FIG. 3 is a cross-sectional view showing the semiconductor integrated circuit device of FIG. 1 processed during a first forming step.

A monocrystalline silicon substrate 3 used as the semiconductor layer 3 is first prepared. The n+-type semiconductor region 7 is then formed on the entire main surface of the monocrystalline silicon substrate 3 as shown in FIG. 3. The n+-type semiconductor region 7 is used as the n-type graft collector region of each bipolar transistor Tr. The n+-type semiconductor region 7 is formed by introducing n-type impurities into the semiconductor layer 3 with an ion implantation process, for example.

Figure 4:
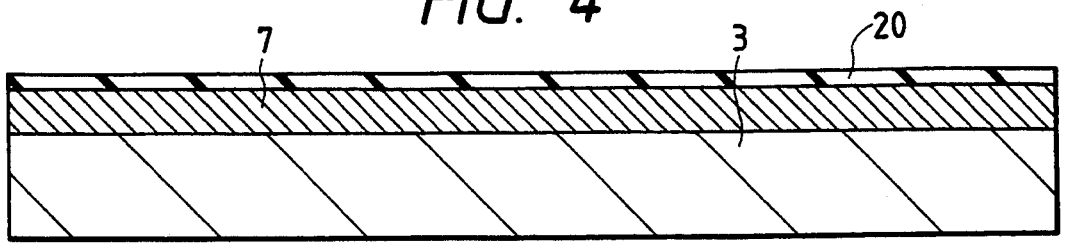
FIG. 4 is a cross-sectional view illustrating the semiconductor integrated circuit device of FIG. 1 processed during a second forming step.

Next, a silicon oxide film 20 formed on the entire main surface of the n+-type semiconductor region 7 as shown in FIG. 4. The silicon oxide film 20 is used as an etching mask and formed by a thermal oxidation process, for example.

Figure 5:
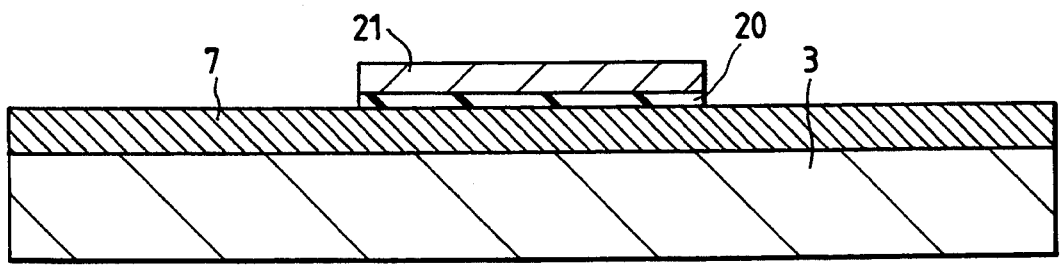
FIG. 5 is a cross-sectional view depicting the semiconductor integrated circuit device of FIG. 1 processed during a third forming step.

Thereafter, the silicon oxide film 20 is patterned so as to leave a desired silicon oxide film 20 in a region for forming each bipolar transistor Tr as shown in FIG. 5. The etching mask 20 is then formed by use of the remaining silicon oxide film 20. The patterning is effected by making use of a photoresist mask formed by the photolithography as shown in FIG. 5.

Figure 6:
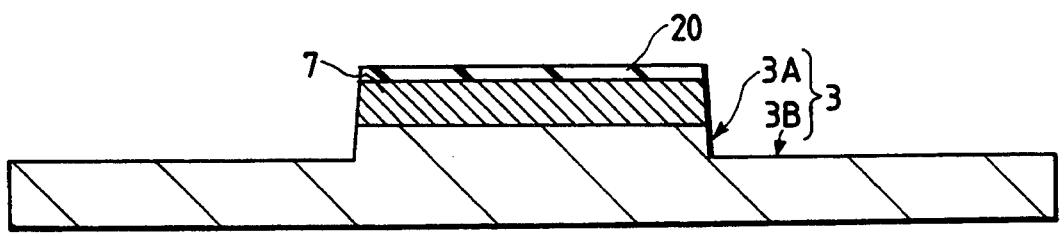
FIG. 6 is a cross-sectional view showing the semiconductor integrated circuit device of FIG. 1 processed during a fourth forming step.

As shown in FIG. 6, the etching mask 20 is next used. In this condition, a portion of the main surface of the monocrystalline silicon substrate 3 is removed from the complementary MISFET forming region by etching thereby to form regions corresponding to the semiconductor layer 3A fabricated in the form of the thick film thickness and the semiconductor layer 3B formed with the thin film thickness.

Figure 7:
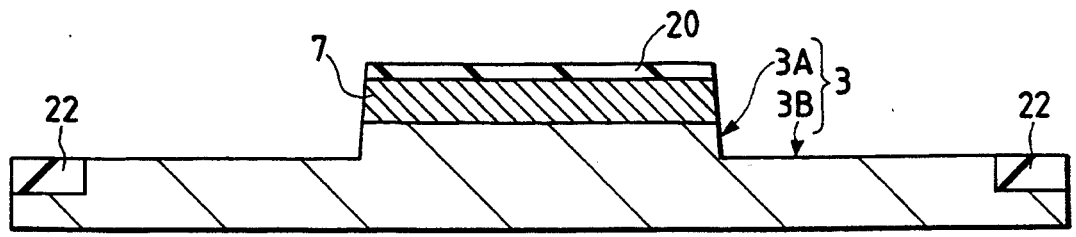
FIG. 7 is a cross-sectional view illustrating the semiconductor integrated circuit device of FIG. 1 processed during a fifth forming step.

Next, stopper layers 22 are formed within the etched region of the monocrystalline silicon substrate 3, i.e., the complementary MISFET forming region as shown in FIG. 7. Each of the stopper layers 22 has a function for determining, in a subsequent step, whether or not the reverse side of the monocrystalline silicon substrate 3 has been chemically polished. Thus, both the film thickness of the semiconductor layer 3A of the semiconductor layer 3 and the film thickness of the semiconductor layer 3B thereof can be set up with high accuracy. Each of the stopper layers 22 is made up of a silicon oxide film formed by, for example, either one of a selective thermal oxidation process capable of ensuring a selection ratio with respect to chemical polishing between each stopper layer 22 and the monocrystalline silicon substrate 3 and an oxygen implantation process.

Figure 8:
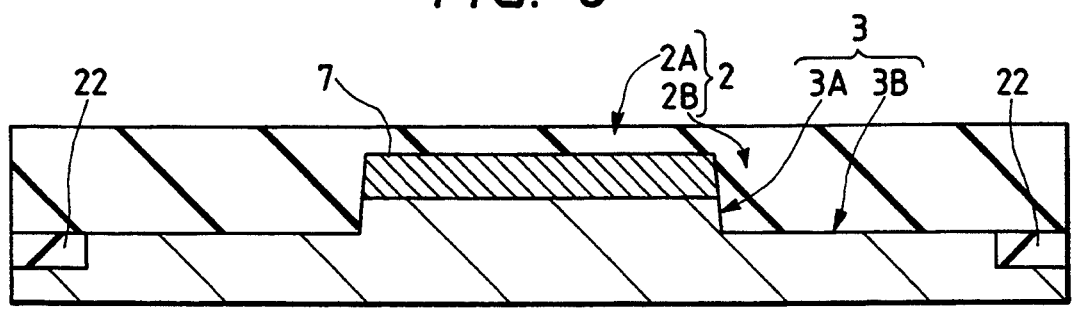
FIG. 8 is a cross-sectional view depicting the semiconductor integrated circuit device of FIG. 1 processed during a sixth forming step.

After the etching mask 20 has been removed, the insulating layer 2 used for separating the semiconductor substrate 1 from the semiconductor layer 3 is then formed on the entire main surface of the monocrystalline silicon substrate 3 as show in FIG. 8. The insulating layer 2 comprises the insulating layer 2A corresponding to the region for the formation of each bipolar transistor Tr and having the thin film thickness, and the insulating layer 2B corresponding to the region for the formation of each complementary MISFET and having the thick film thickness, both of which are formed on the main surface of the monocrystalline silicon substrate 3. Thus, the entire surface of the insulating layer 2 is flattened. The insulating layer 2 is fabricated in the form of a single layer comprised of either one of a silicon oxide film deposited by a quartz bias sputtering process and a silicon oxide film applied and hardened by a SOG (Spin-On-Glass) process or in the form of a stacked layer in which either one of both silicon oxide films is used as a principal component. The insulating layer 2 may be formed by an etching back process which effects the combined use of a photoresist film. Described specifically, a silicon oxide film is first deposited on the entire area of a substrate by the CVD process. Then, a photoresist film which does not have the silicon oxide film and an etching selection ratio, is applied on the surface of the silicon oxide film thereby to flatten the surface of the photoresist film. Thereafter, the surface of the photoresist film is subjected to anisotropic etching so that the surface of the silicon oxide film is made flat. The insulating layer 2 may be formed in this way.

Figure 9:
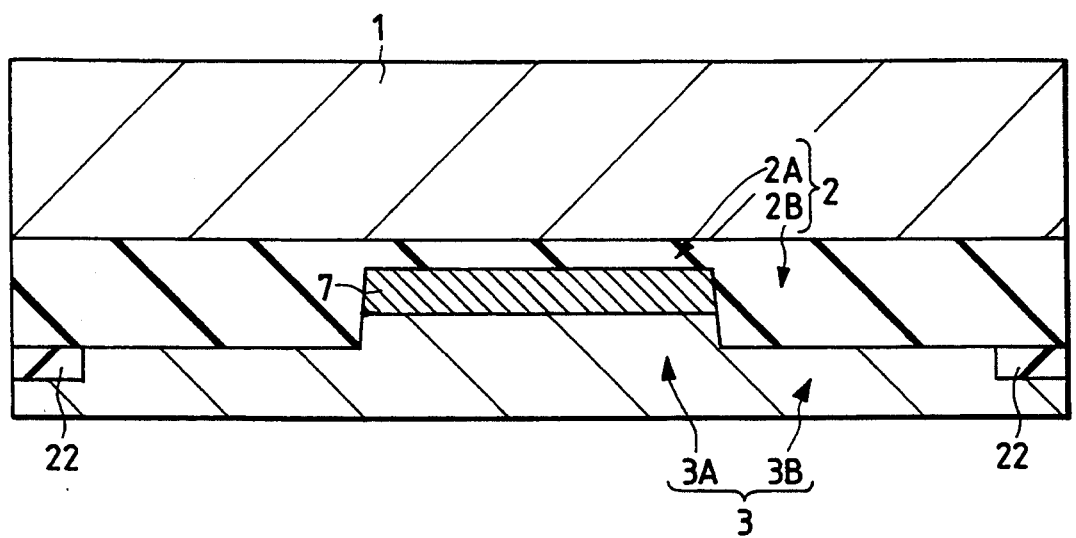
FIG. 9 is a cross-sectional view showing the semiconductor integrated circuit device of FIG. 1 processed during a seventh forming step.

Next, the semiconductor substrate 1 composed of a monocrystalline silicon is bonded onto the surface of the insulating layer 2 as shown in FIG. 9

Figure 10:
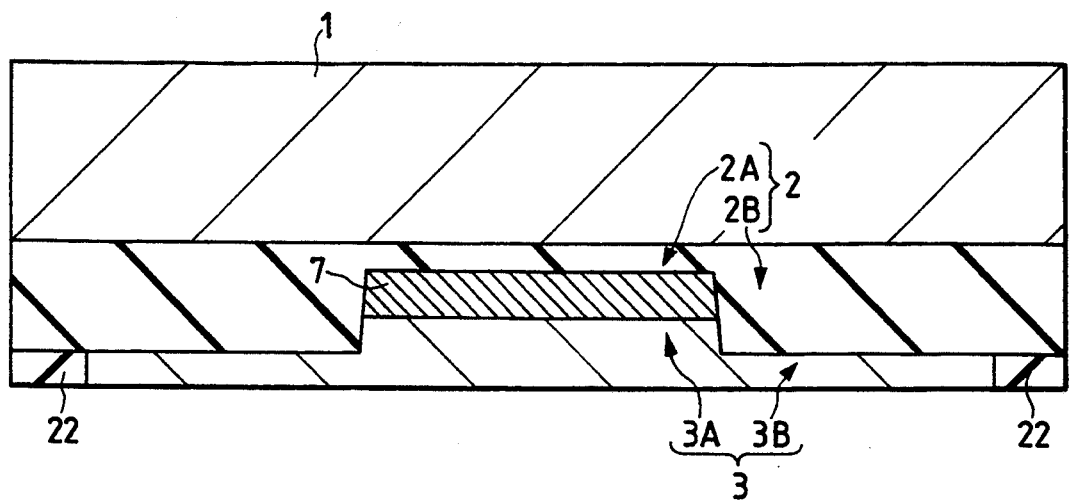
FIG. 10 is a cross-sectional view illustrating the semiconductor integrated circuit device of FIG. 1 Processed during an eighth forming step.

Thereafter, the monocrystalline silicon substrate 3 is processed by a polishing technique as illustrated in FIG. 10. The object of the polishing technique is to chemically polish the reverse side of the monocrystalline silicon substrate 3. The semiconductor layer 3 having the semiconductor layers 3A and 3B which are different in film thickness from each other, is made up of the so-polished monocrystalline silicon substrate 3. As shown in FIG. 10, the film thickness of the semiconductor layer 3, particularly, the film thickness of the semiconductor layer 3B formed with the thin film thickness is adjusted by the pre-formed stopper layers 22. Thus, a so-called SOI substrate formed by superimposing the semiconductor substrate 1, the insulating layer 2 and the semiconductor layer 3 on one another in accordance with the step for forming the semiconductor layer 3 is completed.

Figure 11:
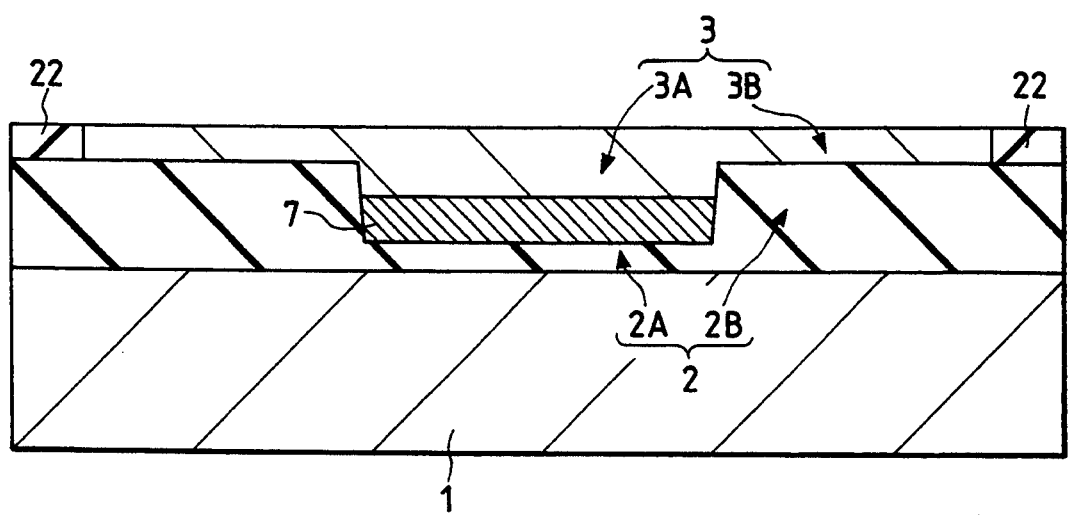
FIG. 11 is a cross-sectional view showing the semiconductor integrated circuit device of FIG. 1 processed during a ninth forming step.

Further, the SOI substrate is reversed as show in FIG. 11 and a device or element forming process is started.

Figure 12:
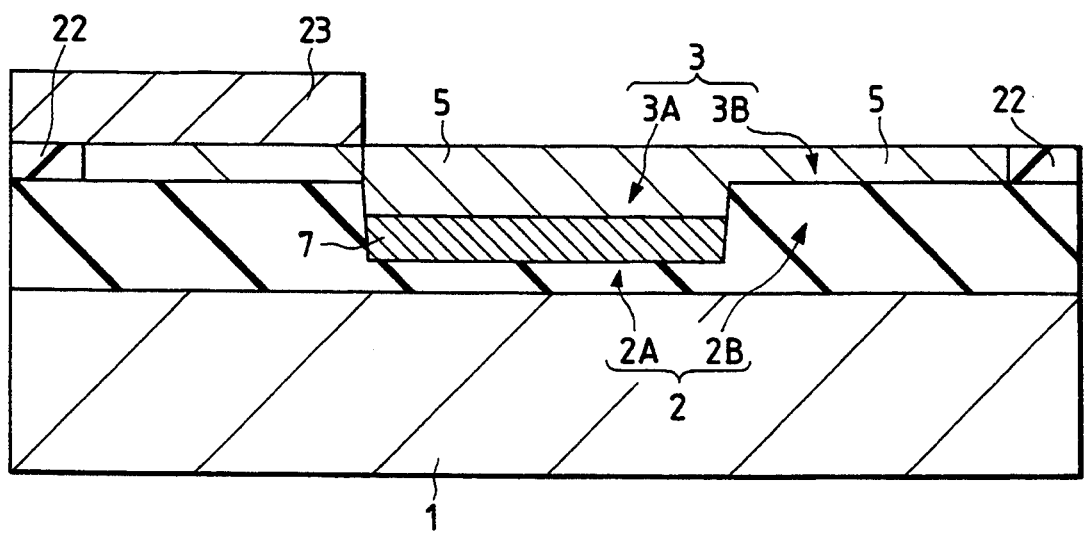
FIG. 12 is a cross-sectional view illustrating the semiconductor integrated circuit device of FIG. 1 processed during a tenth forming step.

As illustrated in FIG. 12, the region for forming the n channel MISFET Qn is first covered with an impurity introduction mask 23. The n-type semiconductor region 5 is then formed in the semiconductor layer 3A corresponding to the region for forming each bipolar transistor Tr and the semiconductor layer 3B corresponding to the region for forming the p channel MISFET Qp. Thereafter, the impurity introduction mask 23 is removed. Further, the n-type intrinsic collector region of each bipolar transistor Tr and the n channel forming region of the p channel MISFIT Qp are respectively formed in the n-type semiconductor region 5. The n-type semiconductor region 5 is fabricated by use of the ion implantation, for example. A photoresist film formed by the photolithography is used as the impurity introduction mask 23.

Incidentally, the SOI substrate employed in the element forming process is previously formed with the n-type graft collector region of each bipolar transistor Tr as described above. It is therefore possible to remove a process for forming the graft collector region used as a complex buried layer using an epitaxial growth technique.

Figure 13:
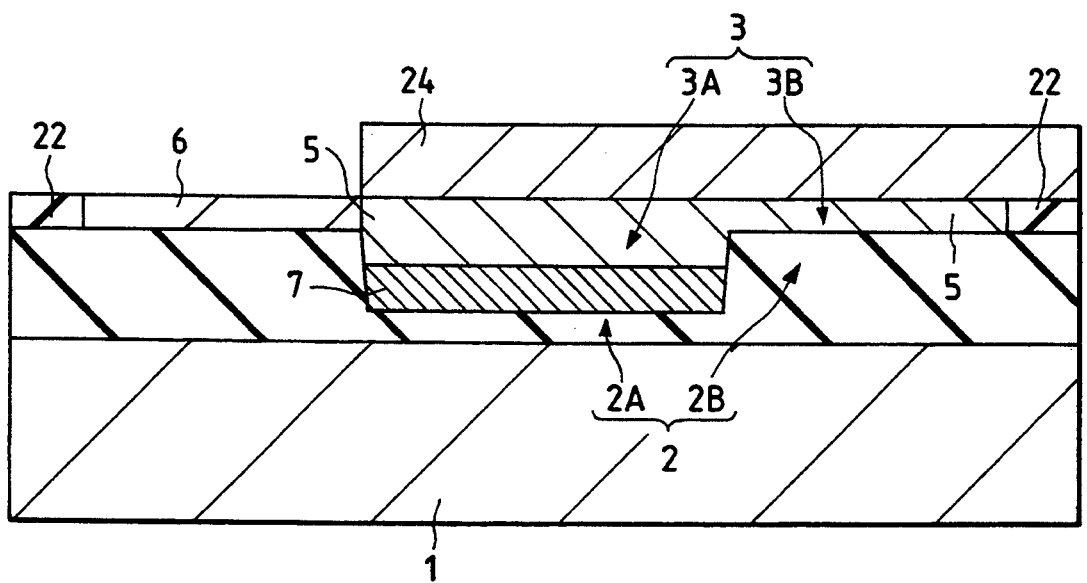
FIG. 13 is a cross-sectional view depicting the semiconductor integrated circuit device of FIG. 1 processed during an eleventh forming step.

Then, the region for forming each bipolar transistor Tr and the region for forming the p channel MISFET Qp are covered with an impurity introduction mask 24 as shown in FIG. 13 thereby to form the p-type semiconductor region 6 in the semiconductor layer 3B which is of the region for forming the p channel MISFET Qp. Thereafter, the impurity introduction mask 24 is removed. The p-type semiconductor region 6 is fabricated in the same method as that employed in the formation of the n-type semiconductor region 5. The p-type semiconductor region 6 is used as the p-type channel forming region of the n channel MISFET Qn.

Figure 14:
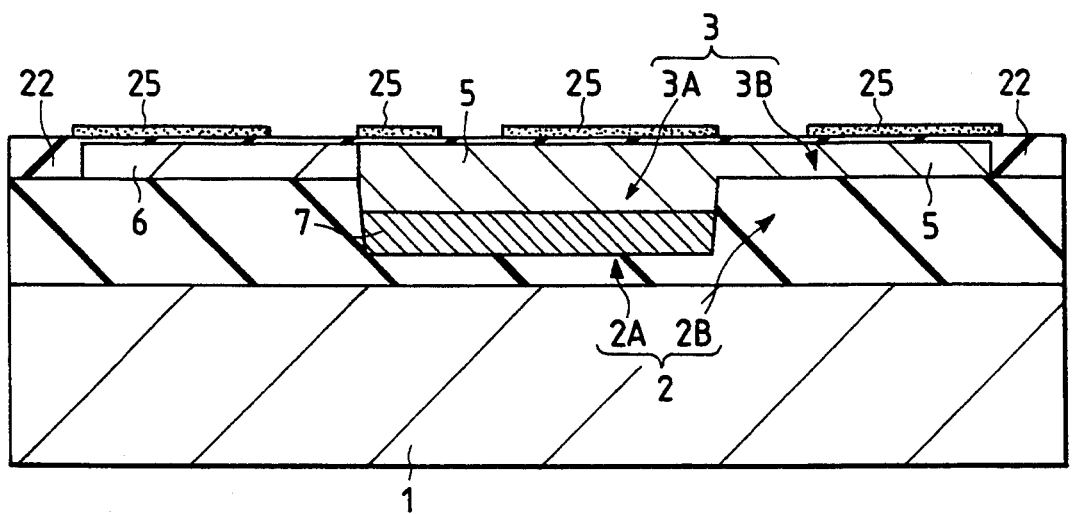
FIG. 14 is a cross-sectional view illustrating the semiconductor integrated circuit device of FIG. 1 processed during a twelfth forming step.

As shown in FIG. 14, a silicon oxide film (free of reference numeral) is further deposited on the entire surface of the semiconductor layer 3 in the form of a thin film thickness. Thereafter, oxidation-resistant masks 25 are formed on the silicon oxide film so as to fall within an active region such as the region for the formation of each bipolar transistor Tr or the like. For example, silicon nitride films are used as the oxidation-resistant masks 25.

Figure 15:
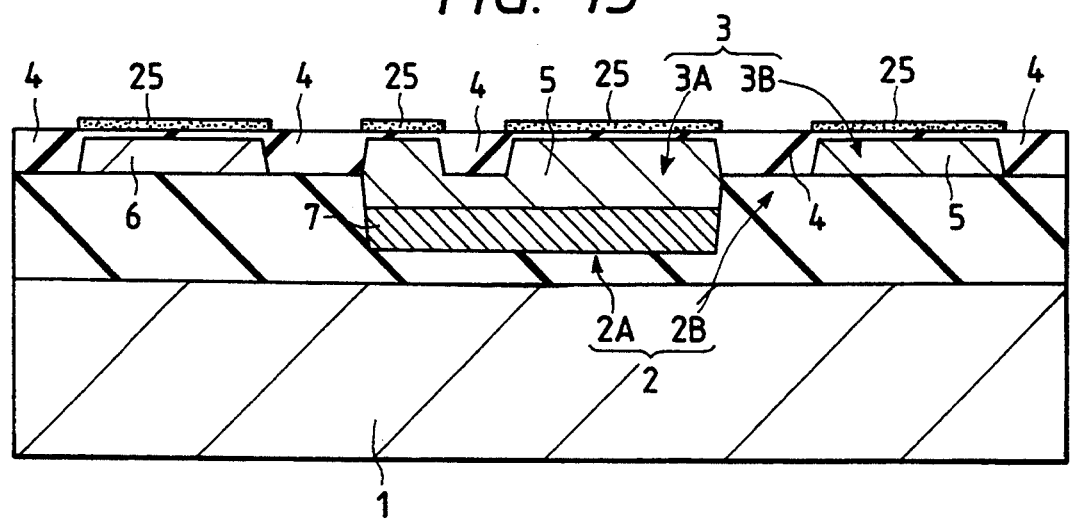
FIG. 15 is a cross-sectional view showing the semiconductor integrated circuit device of FIG. 1 processed during a thirteenth forming step.

As shown in FIG. 15, each of the oxidation-resistant masks 25 is next used so as to oxidize inactive region of the semiconductor layer 3, thereby to form the LOCOS 4 comprised of a silicon oxide film. Thereafter, the oxidation-resistant masks 25 are removed.

Figure 16:
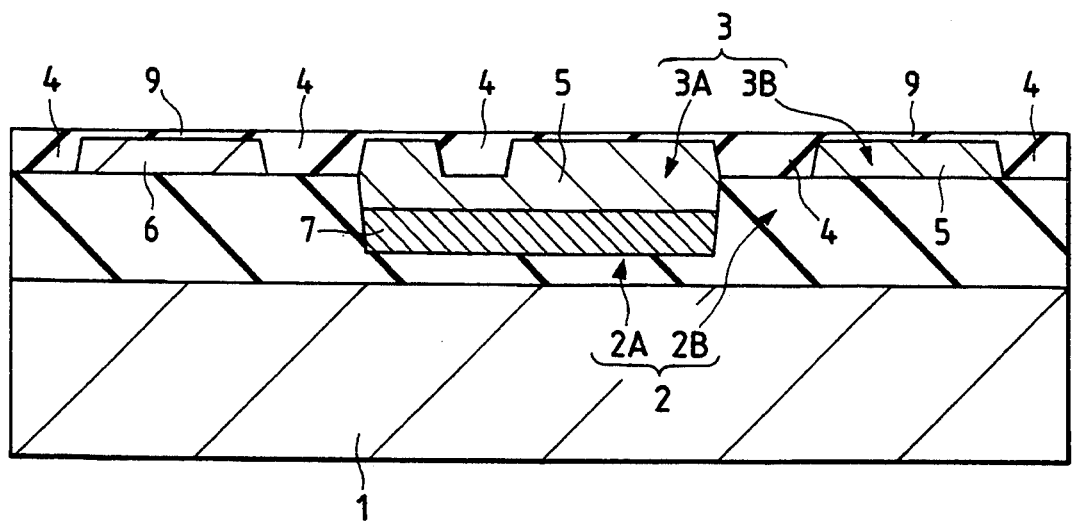
FIG. 16 is a cross-sectional view illustrating the semiconductor integrated circuit device of FIG. 1 processed during a fourteenth forming step.

As illustrated in FIG. 16, each of the gate insulating films is then formed on the surface (i.e., each of the surfaces of the semiconductor regions 5 and 6) of the semiconductor layer 3B so as to fall within at least the region for the formation of each complementary MISFET. Each gate insulating film 9 is formed by the thermal oxidation process.

Figure 17:
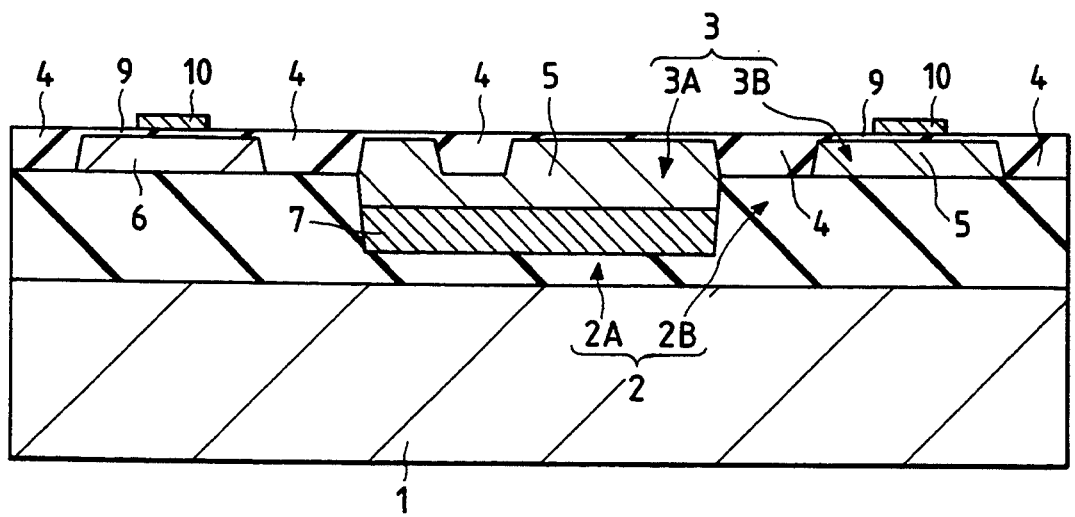
FIG. 17 is a cross-sectional view depicting the semiconductor integrated circuit device of FIG. 1 processed during a fifteenth forming step.

Further, each of the gate electrodes 10 is deposited on the surface of each gate insulating film 9 so as to fall within the region for the formation of each complementary MISFET as shown in FIG. 17. The gage electrodes 10 are formed by depositing polycrystalline silicon films with the CVD process and patterning it with the photolithography and the etching technique. Then., the n-type impurities are added to the polycrystalline silicon films during the deposition of the polycrystalline silicon films or after they have been deposited.

Figure 18:
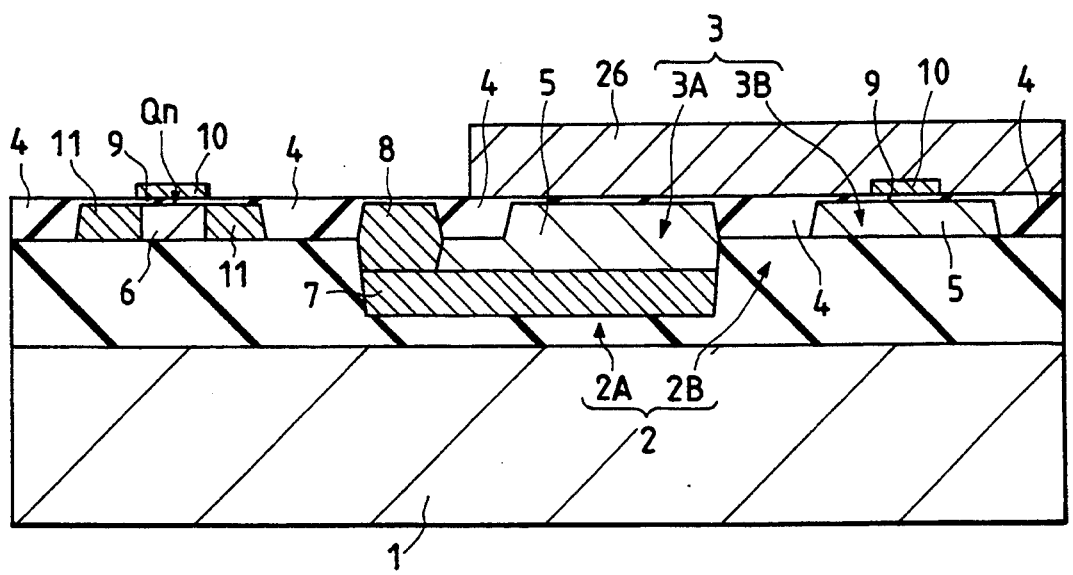
FIG. 18 is a cross-sectional view illustrating the semiconductor integrated circuit device of FIG. 1 Processed during a sixteenth forming step.

Next, the region for the formation of the p channel MISFET Qp and the region for the formation of the p-type base region of each bipolar transistor Tr are covered with an impurity introduction mask 26. Further, as shown in FIG. 18, then n$^+$-type semiconductor regions 11 are formed on the main surface of the p-type semiconductor region 6 of the semiconductor layer 3B so as to fall within the region for the formation of each n channel MISFET Qn. Moreover, the n$^+$-type semiconductor region 8 is formed on a portion of the main surface of the n-type semiconductor region 5 of the semiconductor layer 3A so as to fall within the region for the formation of each bipolar transistor Tr. The n$^{30}$-type semi-conductor regions 11 are formed as the source and drain regions, respectively, of each n channel MISFET Qn. The n$^+$-type semiconductor region 8 is used as the n$^+$-type collector potential-increasing region of the n-type collector region of each bipolar transistor Tr. The n$^+$-type semiconductor regions 11 and 8 are respectively formed by the ion implantation process. Thus, each n channel MISFET Qn is completed in accordance with the step for forming the n$^+$-type semiconductor region 11. Thereafter, the impurity introduction mask 26 is removed.

Figure 19:
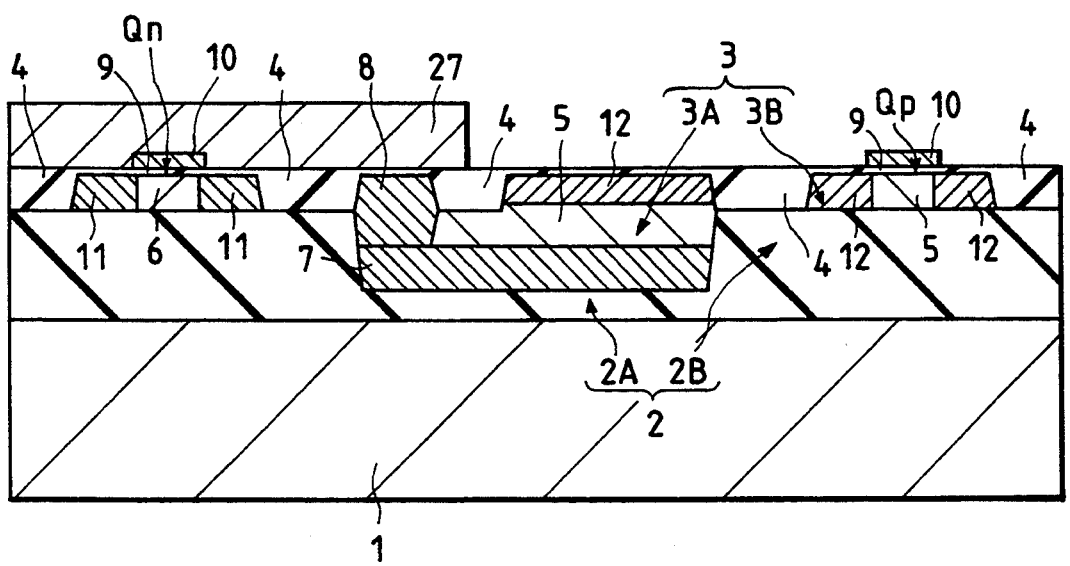
FIG. 19 is a cross-sectional view showing the semiconductor integrated circuit device of FIG. 1 processed during a seventeenth forming step.
Figure 20:
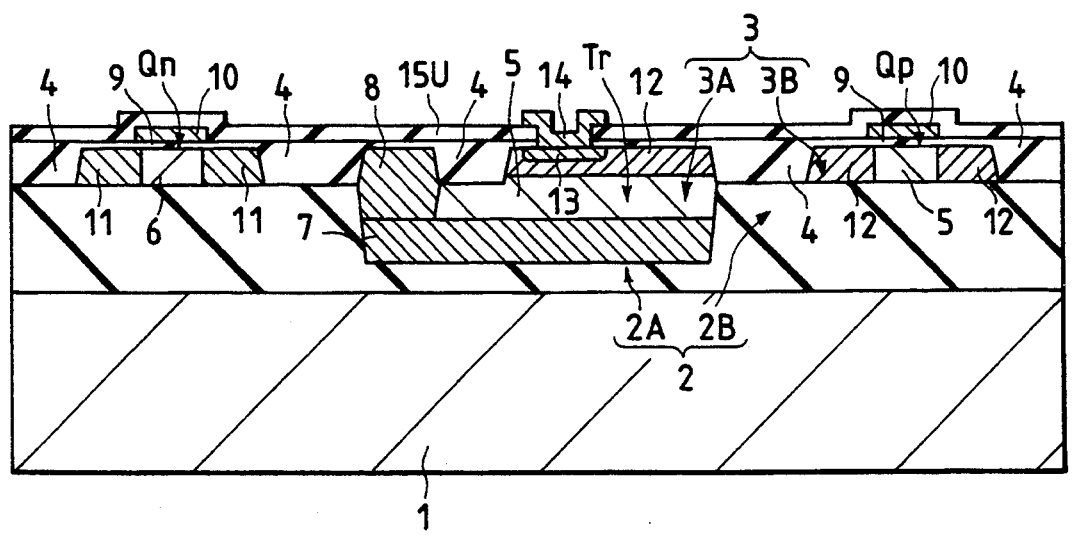
FIG. 20 is a cross-sectional view depicting the semiconductor integrated circuit device of FIG. 1 processed during an eighteenth forming step.

Afterwards, the region for the formation of each n channel MISFET Qn and the n$^+$-type collector potential-increasing region of each bipolar transistor Tr are respectively covered with an impurity introduction mask 27. The p$^+$-type semiconductor regions 12 are formed on the main surface of the n-type semiconductor region 5 of the semiconductor layer 3B so as to fall within the region for the formation of the p channel MISFET Qp as shown in FIG. 19. Further, the p$^+$-type semiconductor region 12 is formed on the portion of the main surface of the n-type semiconductor region 5 of the semiconductor layer 3A so as to fall within the region for the formation of each bipolar transistor Tr. Each p$^+$-type semiconductor regions 12 is formed as the source and drain regions of the p channel MISFET Qp. The p$^+$-type semiconductor region 12 is used as the p-type base region of each bipolar transistor Tr. The p$^+$-type semiconductor region 12 is formed by the ion implantation process. Thus, each p channel MISFET Qp is completed in accordance with the step for forming the p$^+$-type semiconductor region 12. Thereafter, the impurity introduction mask 27 is removed.

Next, an interlayer insulating film 15U is formed on the entire area including the surface of the gate electrode 10 of each complementary MISFET. Thereafter, an emitter opening is defined in the interlayer insulating film 15U so as to fall within the region for the formation of the n-type emitter region of each bipolar transistor Tr. Further, the emitter drawing electrode 14, which makes contact with the surface of the p-type base region through the emitter opening, is formed on the interlayer insulating film 15U. Then, the n-type emitter region is fabricated on the main surface of the p-type base region with the emitter drawing electrode 14 regarded as the impurity diffusion source. The n-type emitter region is made up of an n$^+$-type semiconductor region 13. Thus, each bipolar transistor Tr is completed in accordance with the step for forming the n-type emitter region.

Accordingly, the mixed-type semiconductor integrated circuit device according to the present embodiment is completed by successively forming the interlayer insulating film 15, the connecting hole 16 and the conductor patterns 17 as illustrated in FIG. 1.

Thus, the semiconductor integrated circuit device according to the present embodiment can bring about the following constructions and the following operations and effects based on the constructions.

(1) In the semiconductor integrated circuit device of a type wherein the semiconductor layer 3 is fabricated on the surface of the semiconductor substrate 1 with the insulating layer 2 interposed therebetween, each bipolar transistor Tr is formed in a first region of the semiconductor layer 3, and the MISFET Qn (or Qp) is formed in a second region different from the first region of the semiconductor layer 3, the insulating layer 2A used as the base for each bipolar transistor Tr formed in the first region of the semiconductor layer 3 is formed so as to have a thin film thickness. Further, the insulating layer 2B used as the base for the MISFET Qn formed in the second region of the semiconductor layer 3 is formed so as to have a film thickness thicker than that of the base insulating layer 2A in the first region.

According to the above construction (1), the following operations and effects can be obtained. They are specifically classified into four of (A) to (D). In the case of (A), the thermal resistance of the radiating path between each bipolar transistor Tr and the semiconductor substrate 1 can be reduced. Therefore, the heat generated under the operation of each bipolar transistor Tr can be radiated over the entire area of the semiconductor substrate 1 through the insulating layer 2A which is thin in film thickness. As a result, an increase in temperature of each bipolar transistor Tr can be reduced and the power to be consumed by each bipolar transistor Tr can be increased. Thus, the operating rate of a circuit such as an ECL circuit, which is made up of the bipolar transistors Tr, can be made faster. In the case of (B), the distance between the MISFET Qn and the semiconductor substrate 1 which are spaced away from each other, can be made longer. It is therefore possible to reduce the parasitic capacitance applied to the MISFET Qn, particularly, each of the source and drain regions (11 or 12). As a result, the operating rate corresponding to the discharging rate (or charging rate of the MISFET Qp) of the MISFET Qn can be increased. Therefore, the operating rate of a circuit such as an inverter circuit, which is made up of the MISFET Qn, can be made faster. In the case of (C), both the bipolar transistor Tr and the MISFET Qn are separated from the semiconductor substrate 1 with the insulating layer 5 interposed therebetween. It is also possible to prevent the minority carriers produced by allowing α-rays to enter into the semiconductor substrate 1 from entering into each bipolar transistor Tr and the MISFET Qn. Thus, a characteristic resistant to the soft error caused by the α-rays can be improved. The most suitable effects can be brought about upon construction of a memory circuit. In the case of (D), since each bipolar transistor Tr is separated from the semiconductor substrate 1 with the insulating layer 2 interposed therebetween, a voltage-resistant resistant characteristic between each bipolar transistor Tr and the semiconductor substrate 1 can be improved as compared with the separation of a pn junction.

(2) The semiconductor layer 3A in the first region of the semiconductor layer 3 described in the above construction (1) is thick in film thickness. Further, the semiconductor layer 3B in the second region of the semiconductor layer 3 is thinner in film thickness than the semiconductor layer 3A. Each bipolar transistor Tr of the vertical structure wherein the respective operating regions corresponding to the n-type collector region, the p-type base region and the n-type emitter region are successively arranged along the direction of the film thickness of the semiconductor layer 3A, is formed in the semiconductor layer 3A. The MISFET Qn provided with the channel forming region 6 (or 5) completely depleted when the voltage is applied to the gate electrode 10, is formed in its corresponding semiconductor layer 3B of the semiconductor layer 3.

According to the above construction (2), the following operations and effects other than those described in the above construction (1) can be brought about. They are specifically divided into two of (A) and (B) in the following manner. In the case of (A), the buried n-type collector region (particularly, the n+-type graft collector region and the n+-type semiconductor region 7) formed in the semiconductor layer 3A for each bipolar transistor Tr of the vertical structure can take an increase in the dimension thereof which extends in the direction coincident with the direction of the film thickness of the semiconductor layer 3A. It is therefore possible to decrease the resistance of the n-type collector region and to improve the cut-off frequency $f_T$ of each bipolar transistor Tr. In the case of (B), a punch-through produced between the source and drain regions of the MISFET Qn can be eliminated and the length (channel length or gate length) of the channel forming region can be reduced. Therefore, the rate of switching action of the MISFET Qn can be made faster. Further, since a reduction in the diffusion of carriers and an improvement in the mobility of the carriers can be made within the channel forming region of the MISFET Qn, the rate of the switching action of the MISFET Qn can be rendered faster. Moreover, a Kink characteristic can be prevented from occurring since the channel forming region of the MISFET Qn can be completely depleted.

(3) The sum of the film thickness of the semiconductor layer 3A in the first region where each bipolar transistor Tr in the semiconductor layer 3 described in the above construction (2) is formed and the film thickness of the insulating layer 2A in the first region is equal in dimension to the sum of the film thickness of the semiconductor layer 3B in the second region where the MISFET Qn of the semiconductor Layer 3 is formed and the film thickness of the insulating layer 2B in the second region.

According to the construction (3), the following operations and effects other than those described in tile construction (1) can be brought about. Since the height or thickness of the surface of each bipolar transistor Tr can be made coincident with that of the surface of the MISFET Qn, the surface of each of the devices or elements can be formed in a flat manner. Thus, since the surface of each interlayer insulating film 15 can be made flat, the semiconductor integrated circuit device can prevent the conductor patterns 17 from being electrically disconnected and troubled, for example, and improve the reliability.

(Second Embodiment)

In the present embodiment, a description will be made of another method of forming an SOI substrate employed in a mixed-type semiconductor integrated circuit device according to the second embodiment of the present invention.

The method of forming the SOI substrate employed in the second embodiment of the present invention will now be described in brief with reference to FIGS. 21 through 27 (which correspond to cross-sectional views shown every processing steps).

Figure 21:
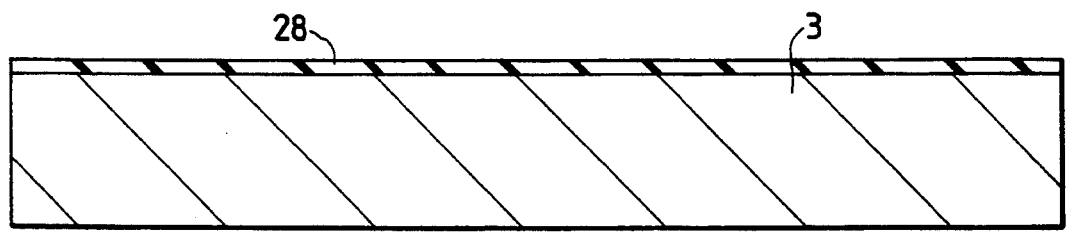
FIG. 21 is a cross-sectional view illustrating a mixed-type semiconductor integrated circuit device according to a second embodiment of the present invention, which is processed during a first forming step.

A monocrystalline silicon substrate 3 is first prepared similarly to the forming process in the aforementioned first embodiment. A silicon nitride film 28 is formed on the entire main surface of the monocrystalline silicon substrate 3 as shown in FIG. 21.

Figure 22:
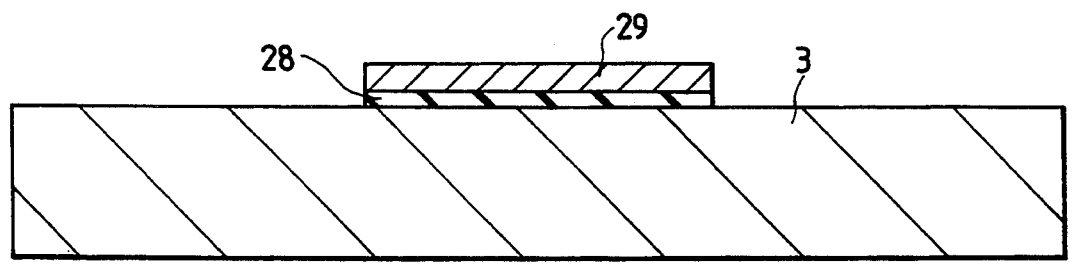
FIG. 22 is a cross-sectional view showing the semiconductor integrated circuit device of FIG. 21 processed during a second forming step.

Next, the silicon nitride film 28 is subjected to patterning. Further, the silicon nitride film 28 is left within a region for forming each bipolar transistor Tr referred to above so as to form an oxidation-resistant mask 28 as shown in FIG. 22. The patterning is effected by etching the silicon nitride film 28 using an etching mask 29 formed by the photolithography. After completion of the patterning, the etching mask 29 is removed.

Figure 23:
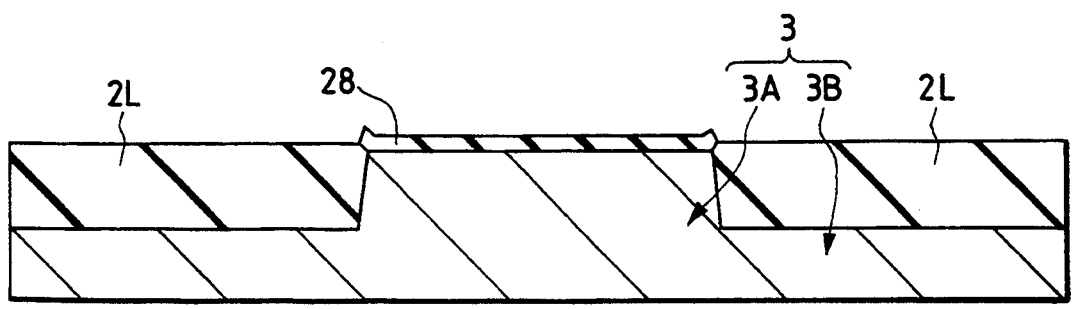
FIG. 23 is a cross-sectional view illustrating the semiconductor integrated circuit device of FIG. 21 processed during a third forming step.

Using the oxidation-resistant mask 28, silicon oxide films 2I are further formed on a portion of a main surface of the monocrystalline silicon substrate 3 so as to fall within a region for forming each MISFET as shown in FIG. 23. Each of the silicon oxide films 2L is formed by the thermal oxidation process and fabricated as a part of an insulating layer 2. After the silicon oxide films 2L have been formed, the oxidation-resistant mask 28 is removed.

Figure 24:
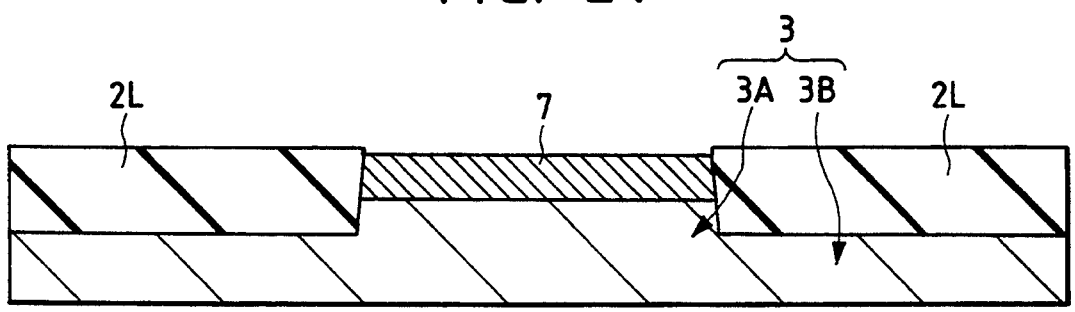
FIG. 24 is a cross-sectional view depicting the semiconductor integrated circuit device of FIG. 21 processed during a fourth forming step.
Figure 25:
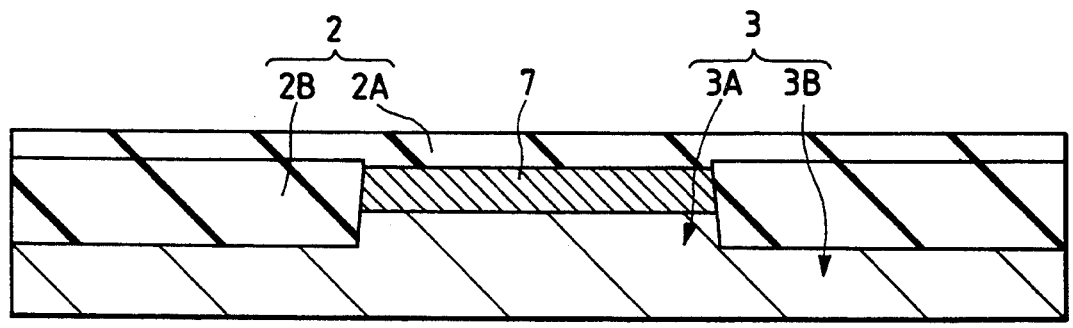
FIG. 25 is a cross-sectional view showing the semiconductor integrated circuit device of FIG. 21 processed during a fifth forming step.

Thereafter, the silicon oxide films 2L are used as impurity introduction masks as illustrated in FIG. 24. Then, an n+-type semiconductor region 7 is formed on a portion of the main surface of the monocrystalline silicon substrate 3 so as to fall within a region for forming each bipolar transistor Tr. The n+-type semiconductor region 7 is formed by introducing n-type impurities into the monocrystalline silicon substrate 3 with the ion implantation process and formed by making a self-alignment with the silicon oxide films 2L. Incidentally, the n+-type semiconductor region 7 is used as an n+-type graft collector region in an n-type collector region of each bipolar transistor Tr.

Then, an insulating film is deposited on the entire areas including the surface of the n+-type semiconductor region 7 and the surfaces of the silicon oxide films 2L. The insulating film 2 is made up of the so-deposited insulating film. The insulating layer 2 comprises an insulating layer 2A which is comprised of the so-deposited insulating film and has a thin film thickness so as to fall within the region for forming each bipolar transistor Tr, and an insulating layer 2B which is made up of the so-deposited insulating film and the silicon oxide films 2L and has a thick film thickness so as to fall within the region for formation of the complementary MISFET.

Figure 26:
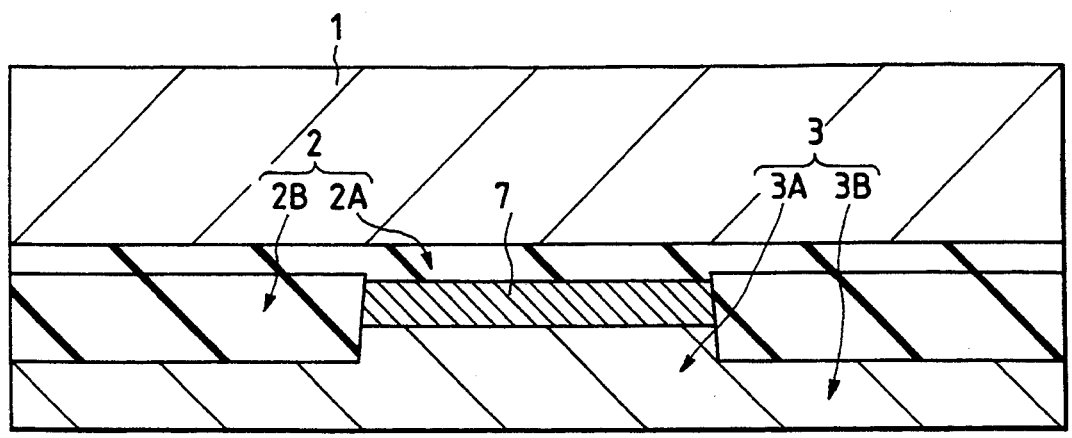
FIG. 26 is a cross-sectional view illustrating the semiconductor integrated circuit device of FIG. 21 processed during a sixth forming step.
Figure 27:
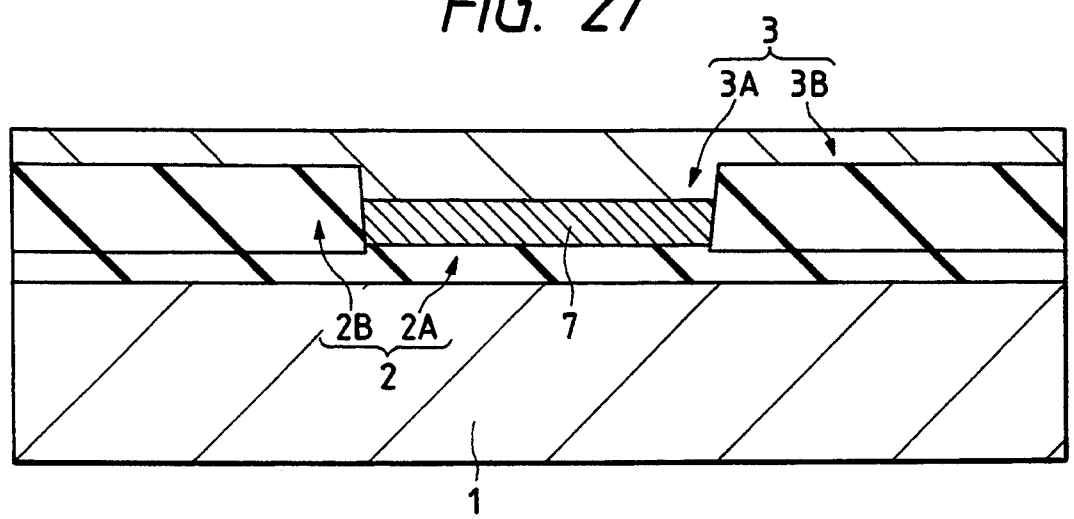
FIG. 27 is a cross-sectional view showing the semiconductor integrated circuit device of FIG. 21 processed during a seventh forming step.

Similarly to the forming process in the first embodiment, a semiconductor substrate 1 is thereafter bonded onto the main surface of the monocrystalline silicon substrate 3 with the insulating layer 2 interposed therebetween as illustrated in FIG. 26. Further, the back of the monocrystalline silicon substrate 3 is chemically polished by the polishing technique, so that the semiconductor layer 3 is made up of the polished monocrystalline silicon substrate 3 as shown in FIG. 27. The SOI substrate is completed after the formation of the semiconductor layer 3 has been finished.

Thereafter, an element forming process is applied to the SOI substrate similarly to the forming process used in the first embodiment, thereby completing the mixed-type semiconductor integrated circuit device according to the present embodiment.

Thus, the semiconductor integrated circuit device according to the present embodiment can bring about the same constructions as those in the first embodiment and operations and effects based on the constructions.

(Third Embodiment)

In the present embodiment, a description will be made of a further method of forming an SOI substrate employed in a mixed-type semiconductor integrated circuit device according to the third embodiment of the present invention.

Figure 29:
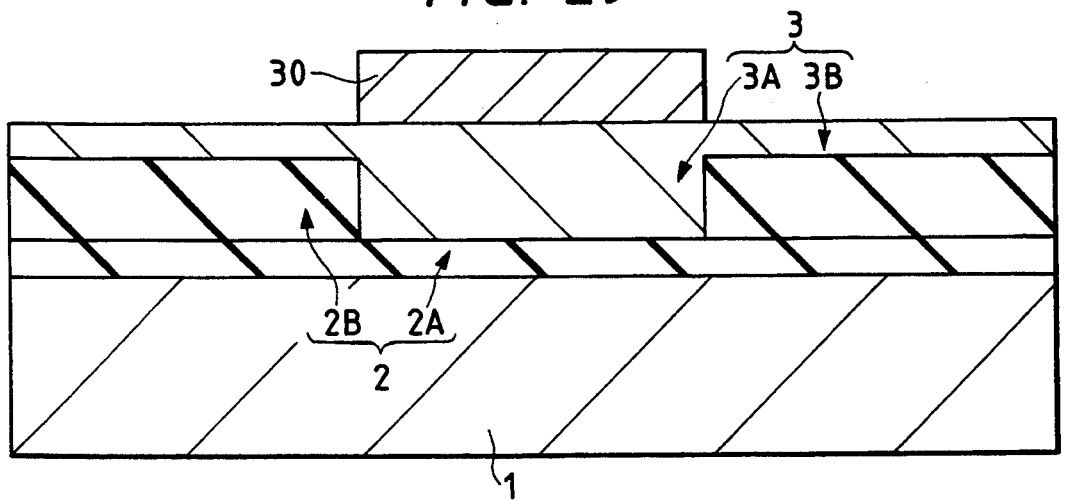
FIG. 29 is a cross-sectional view showing the semiconductor integrated circuit device of FIG. 28 processed during a second forming step.
Figure 30:
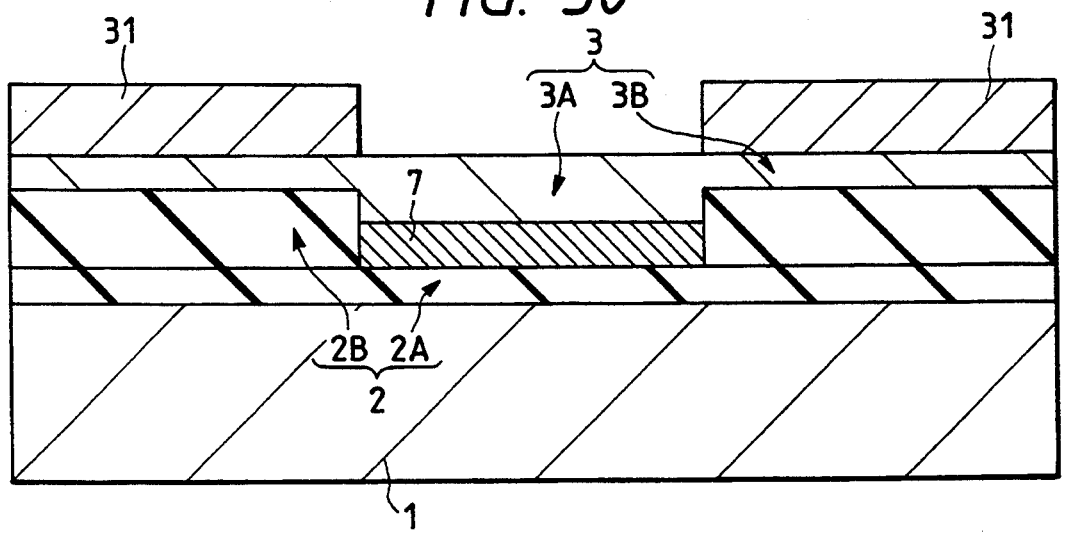
FIG. 30 is a cross-sectional view illustrating the semiconductor integrated circuit device of FIG. 28, which is processed during a third forming step.

The method of forming the SOI substrate employed in the third embodiment of the present invention will now be described in brief with reference to FIGS. 28 through 30 (which correspond to cross-sectional views shown every processing steps).

Figure 28:
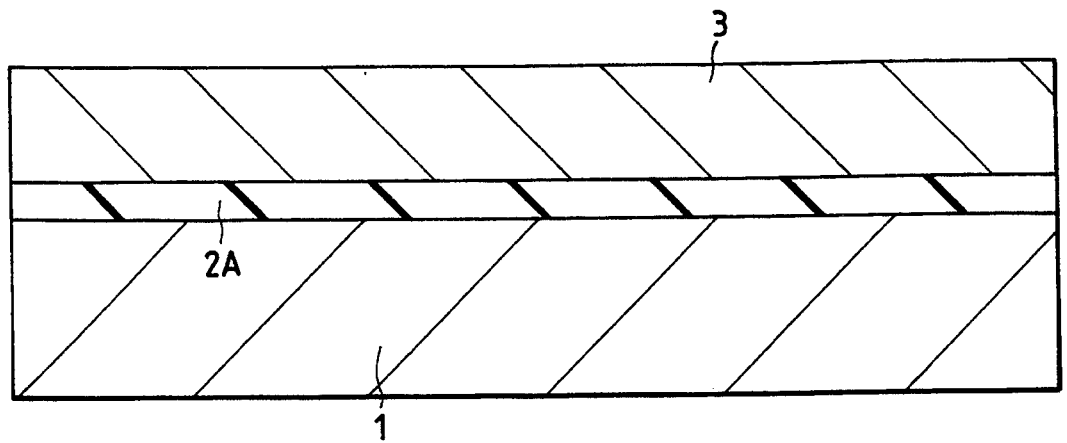
FIG. 28 is a cross-sectional view depicting a mixed-type semiconductor integrated circuit device according to a third embodiment of the present invention, which is processed during a first forming step.

The SOI substrate having a semiconductor layer 3 formed on a main surface of a semiconductor substrate 1 with an insulating layer 2A interposed therebetween is first prepared as shown in FIG. 28. The insulating layer 2A is fabricated in the form of a thin film thickness in advance and the semiconductor layer 3 is shaped in the form of a thick film thickness in advance.

An impurity introduction mask 30 is next fabricated onto the surface of the semiconductor layer 3 so as to fall within a region for forming each bipolar transistor Tr. Further, oxygen is introduced into a deep region of the semiconductor layer 3 by the ion implantation process, using the impurity introduction mask 30. Thereafter, an insulating layer 2B, which is thick in film thickness, is formed within a region for forming a complementary MISFET as shown in FIG. 29, thus completing an insulating layer 2. After the insulating layer 2B of the insulating layer 2 has been formed, a semiconductor layer 3A formed with a thick film thickness and a semiconductor layer 3B formed with a thin film thickness are formed in the semiconductor layer 3. The impurity introduction mask 30 is removed after the formation of the semiconductor 3.

Next, impurity introduction masks 31 are fabricated on the region of the semiconductor layer 3B of the semiconductor layer 3. Further, n-type impurities are introduced into a deep region of the semiconductor layer 3A of the semiconductor layer 3 by the ion implantation process, using each impurity introduction mask 31 thereby to form an n+-type semiconductor region 7. The n+-type semiconductor region 7 is used as an n+-type graft collector region in an n-type collector region of each bipolar transistor Tr. After the formation of the n+-type semiconductor region 7, the SOI substrate similar to that fabricated in each of the first and second embodiments is formed. Thereafter, the impurity introduction masks 31 are removed.

Then, the semiconductor integrated circuit device according to the present embodiment is completed by effecting a device or element forming process in a manner similar to the forming process effected in the first embodiment.

Thus, the semiconductor integrated circuit device according to the present embodiment can bring about the same constructions as those obtained in the first embodiment and operations and effects based on the constructions.

As described above, the invention, which has been made by the present inventor, has been described specifically by the aforementioned embodiments. It should however be borne in mind that this invention is not limited to or by the above-described embodiments. It is needless to say that many changes and modifications can be made without departing from the spirit or scope of the invention as set forth herein.

The present invention may be constructed in such a manner that the semiconductor substrate 1 is made up of a compound semiconductor substrate and each semiconductor layer is formed of a compound semiconductor layer. In the present invention as well, a monocrystal is preferred as the semiconductor layer 3. However, the semiconductor layer 3 may be either a polycrystal or an amorphous substance.

Further, the present invention may be applied to a so-called backward bipolar transistor in which an emitter region is used as a buried type.

Advantageous effects obtained by the representative ones of the invention disclosed in the present application will be described in brief as follows:

(1) In the mixed-type semiconductor integrated circuit device with the SOI structure incorporated therein, the efficiency of heat radiation can be improved and the parasitic capacitance can be reduced. Further, a circuit can be operated at high speed.

(2) In the mixed-type semiconductor integrated circuit device capable of obtaining the above effect (1) and having the SOI structure incorporated therein, a Kink characteristic of each MISFET can be prevented from occurring and the cut-off frequency of each bipolar transistor can be improved.

(3) In the mixed-type semiconductor integrated circuit device capable of obtaining the advantageous effect (2) and having the SOI structure incorporated therein, the surface of each element can be flattened.

What is claimed is:

1. A semiconductor integrated circuit device comprising:
   a semiconductor substrate;
   a first insulating layer formed on a surface of said semiconductor substrate;
   a first and a second semiconductor layer formed on different portions on said first insulating film, each of said first and second semiconductor layers being surrounded by a second insulating layer formed between said first and second semiconductor layers;

a vertical type bipolar transistor formed in said first semiconductor layer, said vertical type bipolar transistor comprising an emitter region, a base region underlying said emitter region and a collector region underlying said base region; and a MISFET formed in said second semiconductor layer, said MISFET comprising a gate electrode and source and drain regions at both edges of said gate electrode, wherein said first insulating layer under said first semiconductor layer is thinner than said first insulating layer under said second semiconductor layer, wherein said first insulating layer extends completely under said first and second semiconductor layers so that said first and second semiconductor layers are completely isolated from said semiconductor substrate, and wherein an upper surface of said first semiconductor layer and an upper surface of said second semiconductor layer are substantially the same height from said surface of said semiconductor substrate.

2. A semiconductor integrated circuit device according to claim 1, wherein the sum of the film thickness of said first semiconductor layer and the first insulating layer under said first semiconductor layer is substantially equal to the sum of the film thickness of said second semiconductor layer and said first insulating layer under said second semiconductor layer.

3. A semiconductor integrated circuit device according to claim 1, wherein the film thickness of said second semiconductor layer is set in such a manner that a channel forming region of said MISFET is completely depleted when a predetermined voltage is applied to said gate electrode.

4. A semiconductor integrated circuit device according to claim 1, wherein said first and second semiconductor layers is comprised of a monocrystalline silicon layer.

5. A semiconductor integrated circuit device according to claim 4, wherein said monocrystalline silicon layer is formed by epitaxial growth.

6. A semiconductor integrated circuit device according to claim 1, further comprising a third insulating layer and wirings for interconnection formed on said third insulating layer, wherein said third insulating layer is formed over said first and second semiconductor layers so as to cover said vertical type bipolar transistor and said MISFET, and wherein said wirings are electrically connected to said vertical type bipolar transistor and said MISFET via through-holes formed in said third insulating layer.

7. A semiconductor integrated circuit device comprising:

a semiconductor substrate;

a first insulating film formed on said semiconductor substrate, said first insulating film having a first portion and a second portion, wherein a film thickness of said second portion is greater than that of said first portion;

a first and a second semiconductor region formed at said first and second portions of said first insulating film, respectively;

a vertical type bipolar transistor formed in said first semiconductor region, said vertical type bipolar transistor comprising an emitter region, a base region underlying said emitter region and a collector region underlying said base region; and a MISFET formed in said second semiconductor region, said MISFET comprising a gate electrode and a source and a drain region at both edges of said gate electrode, wherein a film thickness of said first semiconductor region is thicker than that of said second semiconductor region, and wherein said first insulating film extends completely under said first and second semiconductor regions so that said first and second semiconductor regions are completely isolated from said semiconductor substrate.

8. A semiconductor integrated circuit device according to claim 7, wherein the film thickness of said second semiconductor region is set in such a manner that a channel forming region of said MISFET is completely depleted when a predetermined voltage is applied to said gate electrode.

9. A semiconductor integrated circuit device according to claim 7, wherein the sum of the film thickness of said finest insulating film in said first portion and the film thickness of said first semiconductor region is substantially equal to the sum of the film thickness of said first insulating film in said second portion and the film thickness of said second semiconductor region.

10. A semiconductor integrated circuit device according to claim 7, wherein an Emitter Coupled Logic circuit comprises said bipolar transistor.

11. A semiconductor integrated circuit device according to claim 7, wherein said first and second semiconductor regions are comprised of the identical silicon layer formed on said first insulating film by epitaxial growth.

12. A semiconductor integrated circuit device according to claim 7, further comprising a second insulating film and wirings for interconnection formed on said second insulating film, wherein said second insulating film is formed over said semiconductor layer so as to cover said vertical type bipolar transistor and said MISFET, and wherein said wirings are electrically connected to said vertical type bipolar transistor and said MISFET via through-holes formed in said second insulating film.

* * * * *